(12) United States Patent
Verd

(10) Patent No.: US 11,044,811 B2
(45) Date of Patent: Jun. 22, 2021

(54) HIGH POWER RF CAPACITOR

(71) Applicant: Frederick J Verd, Santee, CA (US)

(72) Inventor: Frederick J Verd, Santee, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 144 days.

(21) Appl. No.: 16/456,534

(22) Filed: Jun. 28, 2019

(65) Prior Publication Data

US 2020/0413541 A1    Dec. 31, 2020

(51) Int. Cl.
| | |
|---|---|
| *H05K 1/16* | (2006.01) |
| *H03H 1/00* | (2006.01) |
| *H05K 3/46* | (2006.01) |
| *H05K 1/02* | (2006.01) |

(52) U.S. Cl.
CPC .......... *H05K 1/162* (2013.01); *H03H 1/0007* (2013.01); *H05K 1/0216* (2013.01); *H05K 3/4644* (2013.01); *H03H 2001/0085* (2013.01); *H05K 2201/093* (2013.01); *H05K 2201/098* (2013.01)

(58) Field of Classification Search
USPC ........................................................ 361/766
See application file for complete search history.

(56) References Cited

U.S. PATENT DOCUMENTS

| | | | | |
|---|---|---|---|---|
| 2007/0164396 A1* | 7/2007 | Jow | .......................... | H01G 4/40 257/532 |
| 2016/0309593 A1* | 10/2016 | Hiroshima | ............. | H05K 1/185 |

* cited by examiner

*Primary Examiner* — Andargie M Aychillhum
(74) *Attorney, Agent, or Firm* — Naval Information Warfare Center, Pacific; Kyle Eppele

(57) ABSTRACT

A high power radiofrequency (RF) capacitor, integrated circuit board/capacitor and methods for manufacture therefor can include a dielectric substrate, and a first metallic layer and a second metallic layer that can be deposited on opposite sides of the dielectric substrate, and a ground plane that can be co-planar with one of the metallic layers. This can establish a broadside coupling capacitance effect between the first metallic layer and the second metallic layer. The first metallic layer and the second metallic layer can have a circular profile when viewed in plan view; alternatively, the first metallic layer and second metallic layer can have a T-shaped profile when viewed in plan view. The desired profile and the desired profile geometry can depend on the design power and operating frequency for the capacitor can depend on whether the capacitor must operate as a series capacitor or a shunt capacitor.

2 Claims, 6 Drawing Sheets

HIGH POWER RF CAPACITOR

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center, Pacific, Code 72120, San Diego, Calif., 92152; voice (619) 553-5118; ssc_pac_t2@navy.mil, reference Navy Case Number 107379.

FIELD OF THE INVENTION

This invention can pertain generally to capacitors. More specifically, the invention can pertain to capacitors that can be integrated into circuit boards as the circuit boards are manufactured. The invention can be particularly, but not exclusively, useful as a capacitor integrated into a circuit board, which can have superior performance for high power applications over a wide frequency range, when compared to capacitors in the prior art.

BACKGROUND OF THE INVENTION

In the current landscape, the number of communication systems is increasing so fast that the Federal Communications Commission (FCC), an independent agency of the United States government created by statute to regulate interstate communications by radio, television, wire, satellite, and cable, is constantly changing the frequency spectrum designations and allocations in order to satisfy everyone's communication needs. Because of the constant shift in frequency band allocations, RF system designers have become aware that flexibility in filtering their RF system so that it operates satisfactorily over a wide frequency is not only required by the FCC, but can also be very important for the efficiency of the communication system itself.

When a higher powered communication system is required, RF filtering components become very important to the system. In an RF system, a good RF filter will protect the system RF amplifier and receiver, and a good RF filter can ensure signals that are out of band are not transmitted or received. It is the RF filter that can keep communication systems within FCC specifications. In most cases, RF filters can include an arrangement of capacitors and inductors. Low power RF capacitors can be readily available in the commercial market, but RF capacitors for higher power applications are not typically as readily available. However, high power RF capacitors are not readily available in the commercial market, at least not at the higher frequency range that is of interest to many military applications. Most high power capacitors on the market today are designed for low frequency systems.

In addition to the above considerations, it can be important to manufacture a capacitor with consistent performance, so that it can provide the same performance over a wide frequency band, at high power, each time, every time. One way to do this can be to actually design the capacitor as part of the circuit board layout, and to actually manufacture the capacitor as the circuit board is manufactured, as a single, integrated unit. Stated differently, a high power RF capacitor could be designed effectively out of printed circuit board material. Furthermore, in doing so, the capacitor could become part of the circuit board layout, which can eliminate excessive complexity of manufacturing processes. This new high power RF capacitor design approach allows the customization of both power and frequency response for a high power communication system.

There can be several advantages to this new style of capacitor. One advantage can be its manufacturability. When using a printed circuit board substrate for the capacitor design, repeatability can be improved. Most printed circuit board manufacturers are able to keep the metal shape tolerances to within 1 to 3 thousandths of an inch (1 to 3 mils). Keeping within these tolerances can produce a consistent capacitor with an accurate repeatable capacitance effect. Another advantage can be when using printed circuit board material as a capacitor, any capacitor shape can be used, including diamond, rectangle, square, oval, serpentine, and other configurations. The various shapes can provide various frequency responses, which can be important in filter design. As an example, a capacitor with a circular profile (when viewed in top plan) can be used in an RF filter design as a shunt capacitor. In the same filter where a series capacitor is required to yield an RF filter having a narrow, high-resolution band response, a branched out multiple T-shape would be used. The T-shape capacitor can produce a broader frequency response and can usually have less loss. Another advantage would be that most printed circuit board material is capable of handling high power. The thickness of the circuit board can also be part of design criteria for an efficient, effective RF filter design.

In view of the above, it can be an object of the present invention to provide a high power RF capacitor with superior performance over a wide frequency for high power application, when compared to capacitors in the prior art. Still another object of the present invention can be to provide a high power RF capacitor with increased RF filter resolution for more effective reception of signals, when the invention is incorporated into a multiplexer that is designed for reception of multiple RF bands. Yet another object of the present invention can be to provide a high power RF capacitor that can be designed and manufactured as part of a circuit board layout, so that the circuit board itself can function as a capacitor. Another object of the present invention can be to provide a high power RF capacitor that can be manufactured in a relatively efficient, cost-effective manner as part of a circuit board, and with repeatable dependable performance according to the capacitance design criteria.

SUMMARY OF THE INVENTION

A high power radiofrequency (RF) capacitor, integrated circuit board/capacitor and methods for manufacture therefor can include a dielectric substrate, and a first metallic layer and a second metallic layer that can be deposited on opposite sides of the dielectric substrate, to establish a broadside coupling capacitance effect between the first metallic layer and the second metallic layer. The first metallic layer and the second metallic layer can have a circular profile when viewed in plan view; alternatively, the first metallic layer and second metallic layer can have a T-shaped profile when viewed in plan view. A ground plane can be provided, and the metallic layers can be deposited so that one of the metallic layers is co-planar with the ground plane.

The desired profile and the desired profile geometry can depend on the design power and operating frequency for the capacitor can depend on whether the capacitor must operate as a series capacitor or a shunt capacitor. For T-shaped profile series capacitors, the profile can be defined by a spine and at least one crossbar. The number or crossbars, as well as the geometry of the spine and crossbars and the spacing between the crossbars, can be based on the design power, operating frequency and RF filters requirements, and can cause metallic layers that have a T-profile to appear in the top plan as the profile of a miniature Yagi antenna. Once the profile is determined, the metallic layers can be placed on the dielectric substrate as the circuit board is manufactured, which can result is an integrated circuit board/capacitor configuration with consistent, repeatable, performance.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF EMBODIMENTS

Figure 1A:
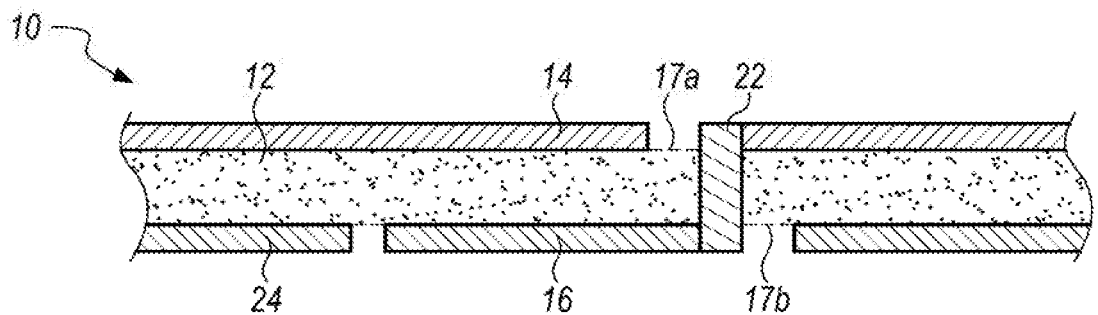
FIG. 1A can be a cross-sectional view of the high power RF capacitor of the present invention according to several embodiments, taken along line 1A-1A in FIG. 2A.
Figure 1B:
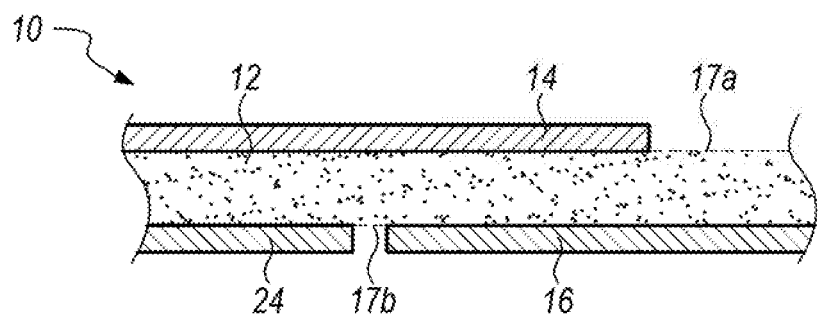
FIG. 1B can be a cross-sectional view of an alternative embodiment of the high power RF capacitor of the present invention according to several embodiments, taken along line 1B-1B in FIG. 2B.
Figure 2A:
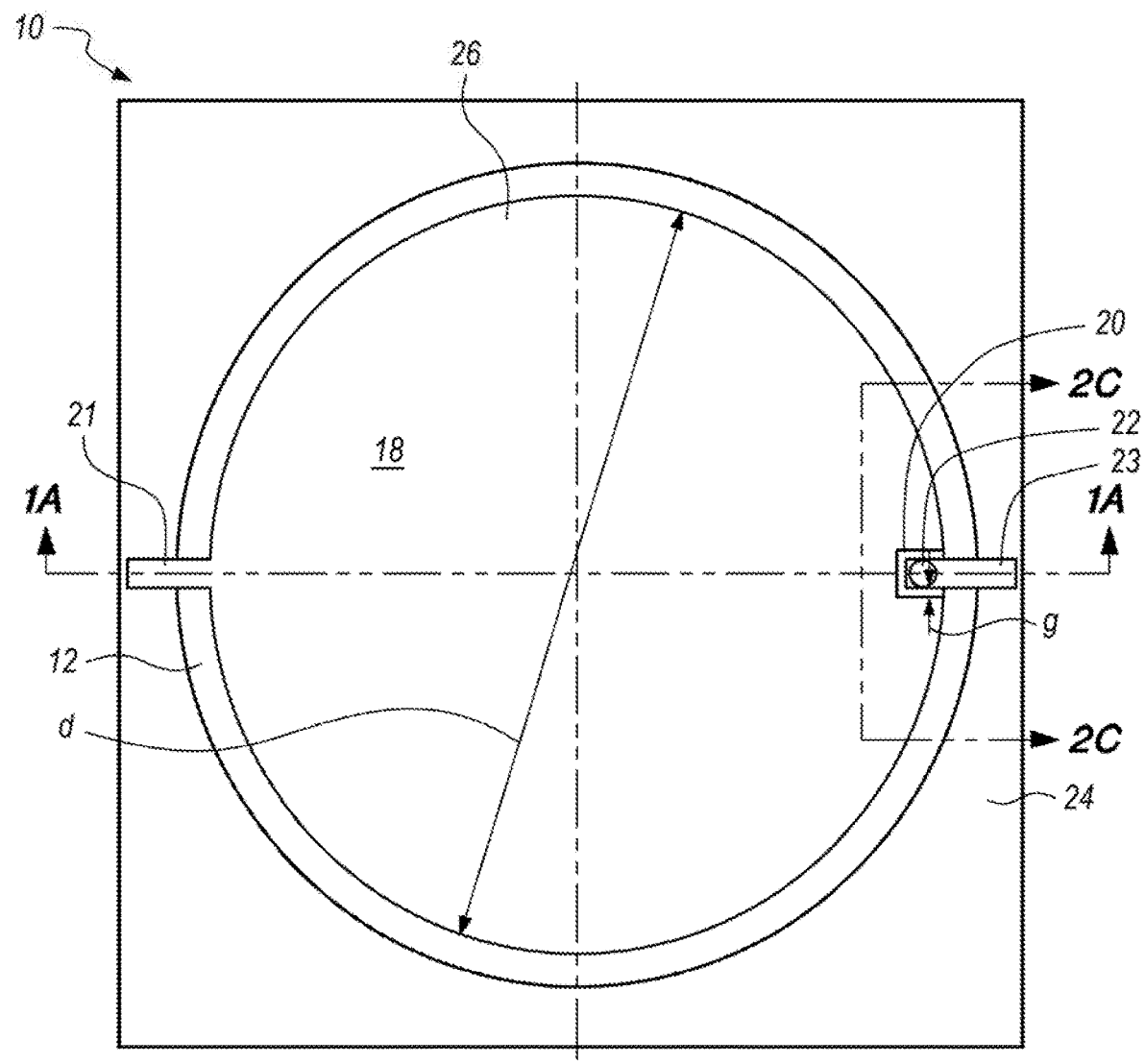
FIG. 2A can be a top plan view of a series capacitor embodiment of the capacitor of FIG. 1A.
Figure 2B:
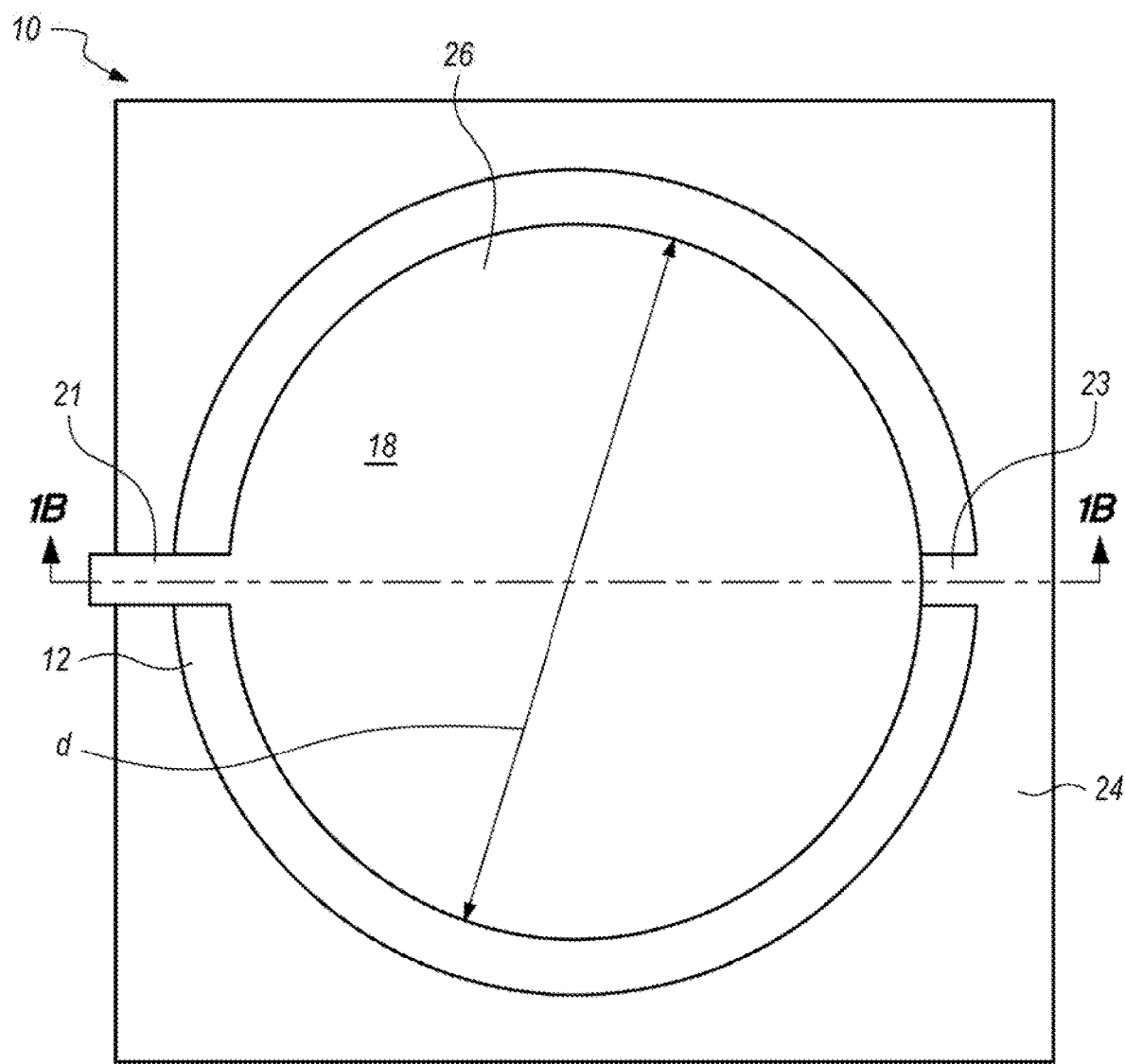
FIG. 2B can be a top plan view of a shunt capacitor embodiment of the capacitor of FIG. 1B.
Figure 2C:
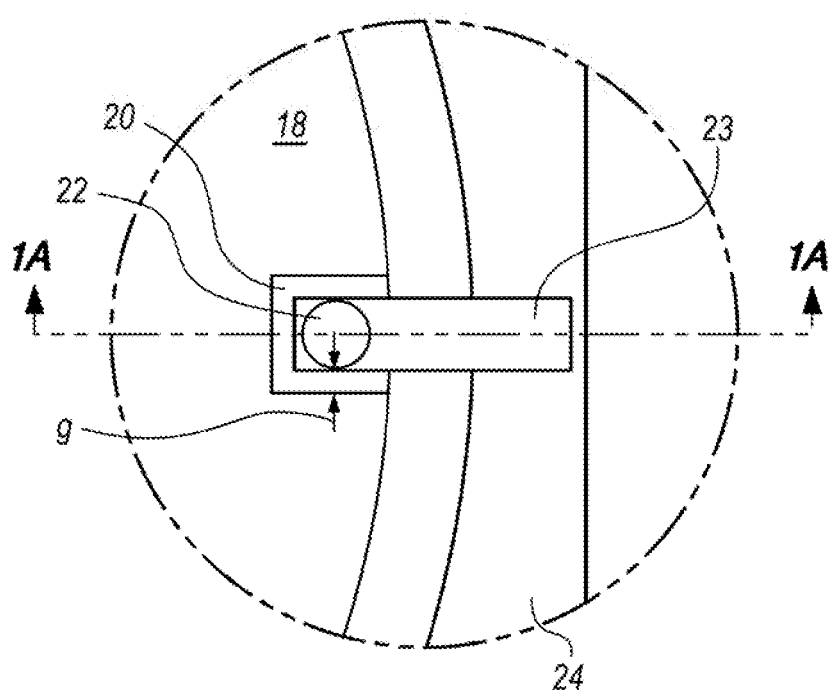
FIG. 2C can be a greatly enlarged portion of the top plan view of the series capacitor embodiments, taken along line 2C-2C in FIG. 2A.
Figure 3:
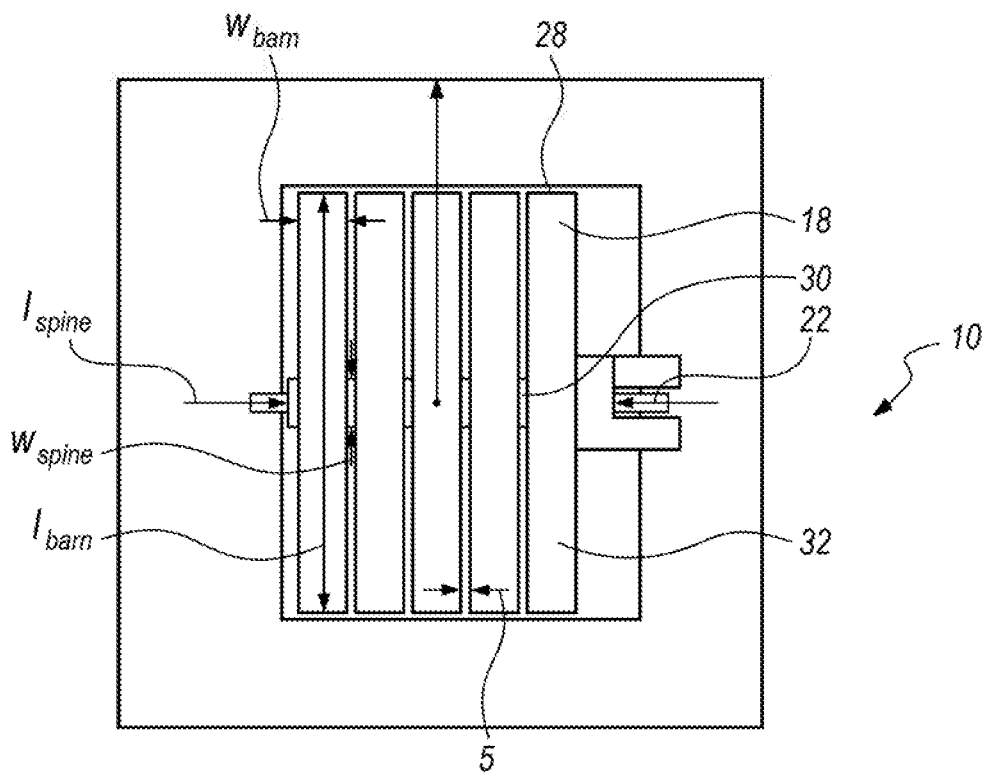
FIG. 3 can be a top plan view of a series capacitor embodiment of the capacitor of FIG. 1A.

Referring initially to FIGS. 1A, 1B and 2-3, a high power RF capacitor in accordance with several methods of the present embodiment can be seen, and can be generally designated using reference character 10. As shown, capacitor 10 can include a substrate 12 and a first metallic layer 14 and a second metallic layer 16 that can be placed on opposite respective first and second surfaces 17a, 17b of substrate 12. The substrate 12 for capacitor 10 can be layered on a ground plane 24. The ground plane 24 can be co-planar with one of the metallic layers 14. In FIGS. 2A and 2B, ground plane 24 is shown in plan view as being co-planar with second metallic layer 16, but ground plane 24 could easily be co-planar with first metallic layer 14 instead. A via 22 as seen in FIGS. 1A, 2A, 3 can extend from one of the metallic layers 14, 16 and extend through the substrate 12 and contact the other metallic layers 14, 16.

The above configuration can result in metallic layers 14, 16 that can be broadside coupled. As used herein, the term "broad coupling" and/or "broadside coupled" can be taken to mean that to establish the capacitive effect, the substrate 12 can function as the dielectric, and metallic layers 14, 16 can be in parallel planes that can be spaced apart. When one of metallic layers 14, 16 is energized, charge can build up on the "broadside" surface of one of the metallic layers 14, 16, i.e., metallic layer 14, 16 surface that contacts respective surface 17a, 17b the substrate 12. This can occur until enough charge builds up to transfer to the broadside surface of other metallic layer contacting the substrate, and thereby provide the capacitive charging and discharging effect. The can be in contrast to prior art capacitors, where a metallic layer can be placed on a substrate, and formed into geometric shapes (in FIG. 1C the shapes are rectangular) that can be co-planar (i.e. the geometric shapes can be on the same side of the substrate). In this configuration, the capacitive effect can occur between the edges of the geometric shapes, and the geometric shapes are edge coupled, as shown in prior art FIG. 1C. The substrate 12 viewed in cross-section in FIGS. 1A and 1B can be between 1 and 500 mils thick. The metallic layers 14, 16 can be between 0.5 and 5 mils thick, when viewed in cross-section.

In some embodiments, the substrate dielectric can be a printed circuit board, and first metallic layer 14 and second metallic layer 16 can be formed (deposited) onto the board as the board substrate 12 can be manufactured. Moreover, for some embodiments, the metallic layers 14, 16 can further be etched to yield pairs of first metallic plates 18 and second metallic plates 20 that can have geometric profiles when view in plan view, as well as trace 21 leading to and from metallic plate 20 and trace 23 leading to and from metallic plates 18. As shown in the plan view FIGS. 2A-2C, and 3, the size and shape of the geometric profiles can be chosen according to the bandwidth of desired frequency response and number of radiofrequency (RF) channels (bandwidths) that can be required. The capacitor and methods for manufacture can designed as part of the board layout and capacitors that are needed for the application can literally be manufactured as the board itself is being manufactured. This can result in RF capacitors that can be manufactured with extremely close tolerances, and that can produce a consistent, repeatable capacitive effect.

For example, and referring now to FIG. 2A and FIG. 2B, it may be necessary to incorporate the capacitors into the board design. For these embodiments, the geometric profile can be a circular profile 26, with the diameter d of high power RF capacitor 10 being selected according to the capacitance requirements for the circuit the particular capacitor is being integrated into. In FIGS. 2A-2C, metallic layer 16 may be etched to yield the metallic plate 18. Metallic layer 14 may be etched to form plate 20. Plate 20 is thus co-planar with ground plane 24. In plan view FIGS. 2A and 2B, metallic plate 20 is under metallic plate 18, into the page.

In some embodiments, the capacitor 10 may be configured as a series capacitor in an RF filter. For these embodiments, the capacitor could be used to pass the desired frequencies through the capacitor with the least amount of loss in the pass band frequency range. As such, it may be desirable to include a via 22 to keep the desired frequencies on the top layer so all the signal traces use the same ground plane. In FIGS. 2A, and 3, the size of via 22 can be chosen based on the required power handling for the capacitor 10.

In some embodiments, the via 22 can be a plated thru-hole. As shown in FIG. 2A, capacitor 10 can further include a gap "g" that can be established between plate 18 and trace 23 of metallic plate 20. The width of gap g can be chosen to minimize arcing during operation of capacitor 10.

Figure 1C:
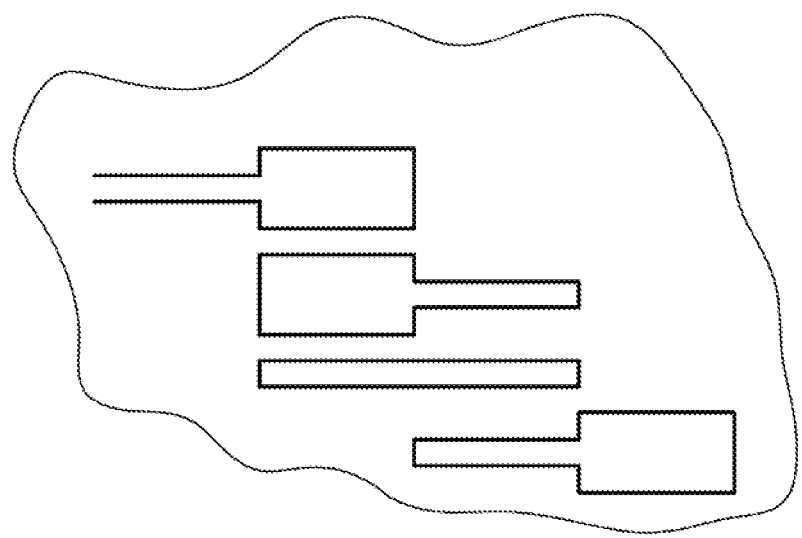
FIG. 1C can be a top plan view of a circuit board capacitor in the prior art that can be edge coupled.

On the other hand, there may be cases where the capacitor is used as a shunt capacitor, and it may be desirable to shunt unwanted frequencies to ground. For these instances, and as shown In FIGS. 1B and 2B, no via 22 can be required. As seen in FIG. 2B, the plate 18 can be formed from metallic layer 14. The plate 20 (not shown in FIG. 2B, but under plate 18), can be formed from metallic layer 16, and can be in the same plane and coupled to a portion of the ground plane 24, with no via 22 to return the signal to a common plane as plate 18 formed from metallic plate 14.

As an alternative to the circular profile of FIGS. 2A and 2B, and referring now to FIG. 3, it may be desired to have a capacitor 10 that can accomplish an RF filtering function. For these capacitances and effects, a T-shaped profile 28 as shown in FIG. 3 can be used.

For these T-profile configurations, and as cited above and shown in FIG. 3, the T-shaped profile 28 can be defined by a spine 30 and a plurality of crossbars 32 that can be perpendicular to spine 30. The length $l_{spine}$ and thickness $t_{spine}$ can be chosen according to the design RF filtering bandwidth and resolution. Similarly, the length $l_{barn}$, and width $w_{barn}$ of each of n crossbars 32 can similarly be chosen, as well as the spacing s between the crossbars. The $l_{barn}$ can act as a quarter wave smoothing device in the design.

In cases where multiple RF band filtering is desired, spacing s can be dependent upon the quarter wavelength $\lambda/4$ for each RF band for which filtering can be desired. In FIG. 3, the dimensions for each crossbar 32 and spacing s between crossbars are uniform, however, these dimensions will often be different when multiple RF filter band are desired. In sum, series capacitors 10 with this profile (when viewed in plan) can literally be designed as a "Yagi capacitor" because the plate 18 can appear to have the profile of a miniature Yagi antenna when viewed in plan view. With these configurations, the high power RF capacitors 10 according to several embodiments can have improved performance over a wider frequency range. The skilled artisan may appreciate that the term "high power" is relative. A cell phone can typically use between on quarter and one half Watt of power. Some engineers can consider 3 watts to be high power, while others may consider 10 Watts as "high power". For high gain/long range applications or similar types of considerations, and as used herein, the term "high power" means for applications having an input power $P_{in}$ of 100 Watts or more.

Figure 4:
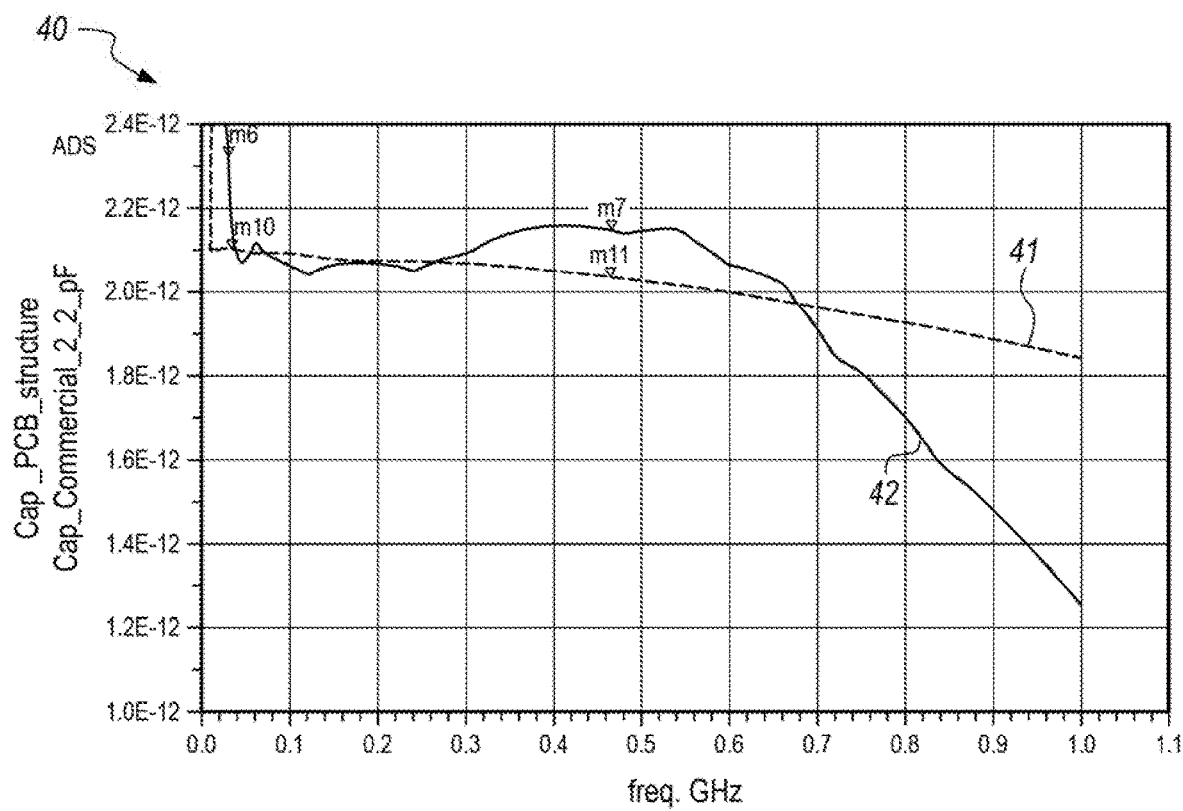
FIG. 4 can be a graph of capacitance versus frequency, which can be used to illustrate the improved performance of the high power RF capacitor of the present invention over a wide frequency range, when compared to the prior art.
Figure 5:
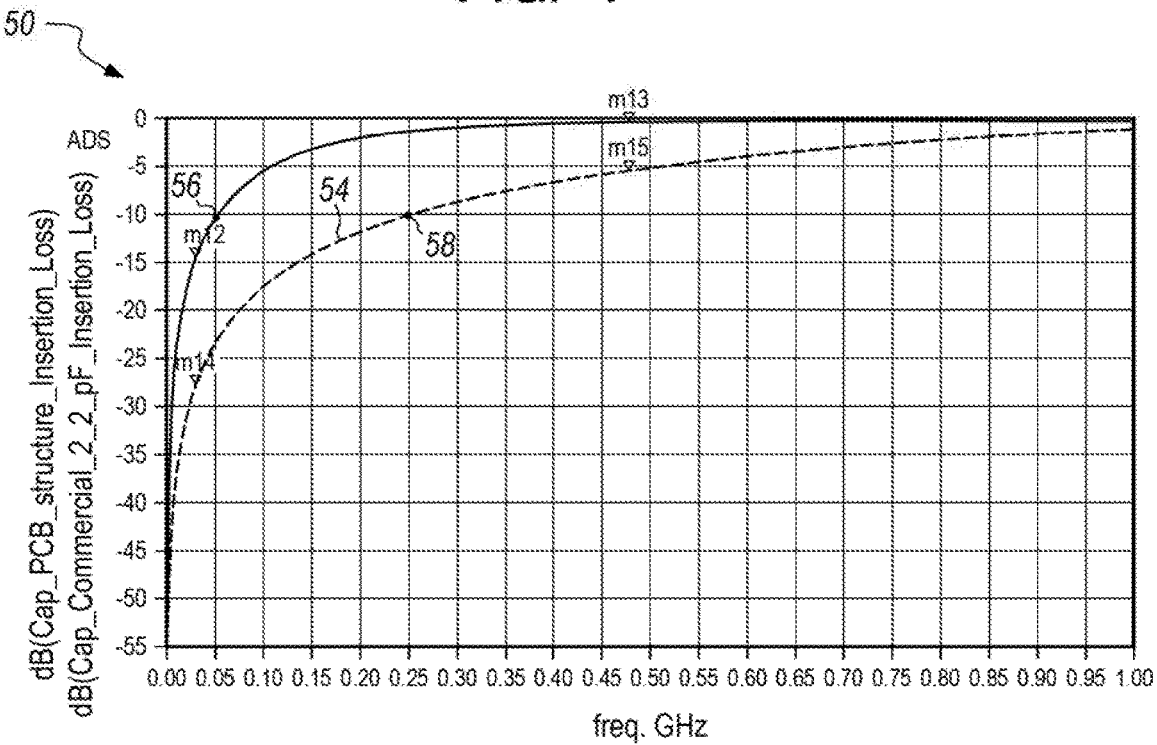
FIG. 5 can be a graph of insertion loss versus frequency, which can be used to illustrate the improved performance of the high power RF capacitor of the present invention over a wide frequency range, when compared to the prior art.
Figure 6:
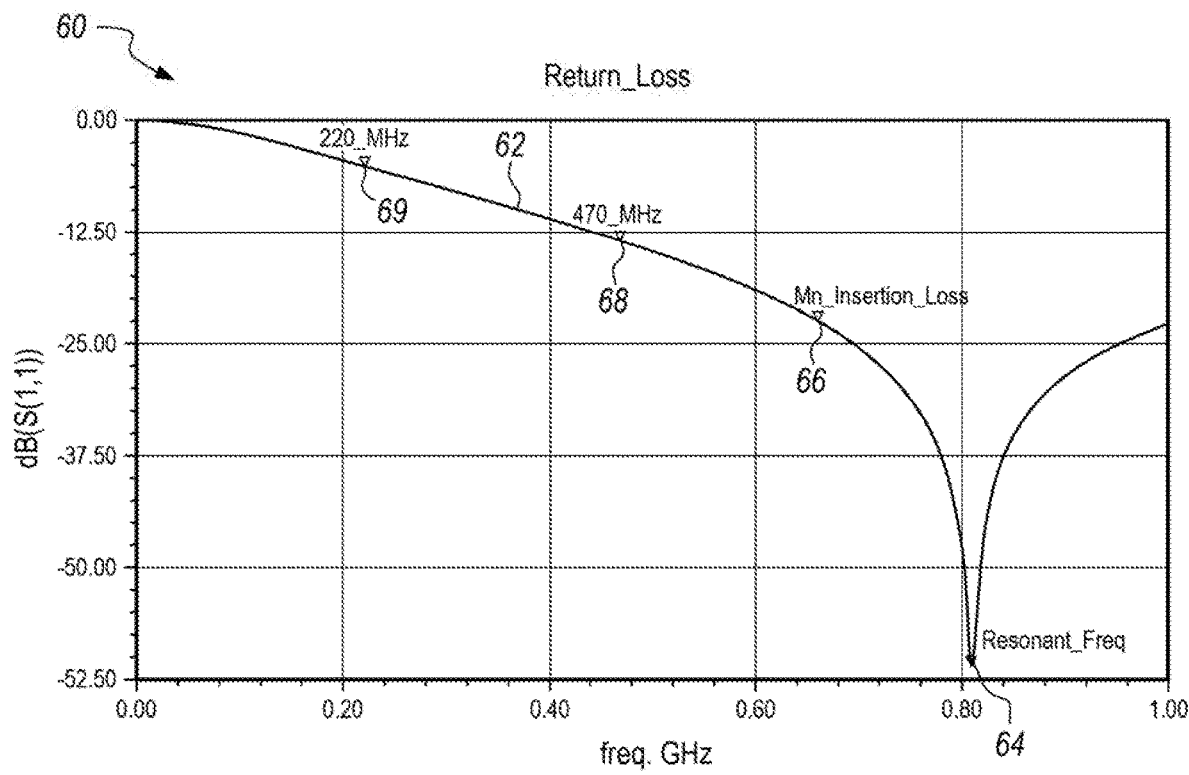
FIG. 6 can be graph of return loss versus frequency, which can be used to illustrate the improved performance of the high power RF capacitor of the present invention over a wide frequency range, when compared to the prior art; and, FIG. 7 can be a block diagram, which can depict steps that can be taken to accomplish some of the methods of the present invention according to several embodiments.

To confirm this, and referring now to FIGS. 4-6, lab measurements of the frequency response (FIG. 4) and insertion loss (FIG. 5) of a 2.2 pF commercial manufactured capacitor frequency response and insertion loss were compared to the high power RF coupling (T-profile) capacitor of the present invention according to several embodiments. To do this, and ANSYS® brand High Frequency Structure Simulator computer program was used for the measurements resulting in FIG. 4. A Rogers 4350B substrate 12 that was 16.6 mil thick can be used for the HFSS simulations depicted in FIGS. 4-6.

Referring to FIG. 4, a graph 40 of capacitance versus operating frequency (at constant power) can be shown. Line 41 in FIG. 4 can be a graph of capacitance of the capacitor 10 of the present invention, while line 42 can be a graph of capacitance performance of a 2.2 picoFarad (C=2 pF) capacitor that can be commercially available. As can be seen in FIG. 4, line 40 implies that a 2 pF capacitor 10 of the present invention can maintain capacitive performance within 10 percent of design value over an absolute huge frequency range, for DC to 1 GHz. This is in contrast to a prior art capacitor curve 42, which illustrates that the 2 pF capacitor corresponding to this graph is only within 10% of design capacitance between 50 MHz (point 44) and about 750 MHz (point 46). Additionally the response of the 2 pF high power RF capacitor 10 of the present invention remains relatively constant over the entire frequency range, when compared to prior art curve 42, which fluctuates, even within the 10% frequency range of operation. From the above, this means that the high power RF capacitor 10 of the present invention can result in an even, uniform response over a given frequency range, which can further allow for greatly increased RF filter resolution and accuracy when incorporated into an RF filter application.

Referring now to FIG. 5, a graph of insertion loss versus frequency is shown. Graph 50 includes a line 52 that can be representative of the series (T-profile) 2 pF embodiment of high power RF capacitor 10 of the present invention, while line 54 can be a graph of a commercial 2.2 pF prior art capacitor. Assuming a given design insertion loss (for example, a maximum insertion loss of 10 dB) it can be seen that the high power RF capacitor 10 can have acceptable performance from about 25 MHz (point 56), while the commercial variant does not exhibit acceptable insertion loss performance until about 250 MHz (point 58).

Referring now to FIG. 6, a graph 60 of return loss versus frequency is shown. Graph 60 include a line 62 that can be representative of return for a high power RF capacitor 10 according to several embodiments. In FIG. 6, it can be seen for a design frequency of 810 MHz (point 64) the minimum design return loss can be about =61 dB. It can be seen for a design frequency of 660 MHz (point 66), the minimum design return loss can be about −22 dB. It can also be seen from point 68 that at 470 MHz the insertion loss is about −13 dB, and from point 69 it can be seen that at 220 MHz, the return loss can be about −5 dB. That can mean that the signal at that frequency will be reflected back to the source that much (in absolute terms) lower than the original signal supplied from the source. For example, for an example signal at 220 Mhz as seen from point 69, the signal at 220 Mhz will be reflected back to the source 5 dB lower than the signal supplied from the source. A lower return loss may reflect an efficient capacitor that is effectively accomplishing an RF filtering function. Thus, the design may be selected so that the return loss is acceptable in the circuit the capacitor is designed for, e.g. the filter circuit.

From the above, it can be seen that according to measurements and simulations, a PCB designed capacitor is more stable across frequency and has less loss than a commercially manufactured high power capacitor. When comparing different shaped PCB capacitors, the T-Shaped capacitor simulations exhibited less insertion loss than the Circular capacitor. Circular PCB capacitor's minimum insertion loss simulated 0.237 dB. T-Shaped PCB capacitor's minimum insertion loss simulated 0.195 dB. The Circular shaped PCB capacitor simulated better overall return loss. T-Shaped PCB capacitor simulated a resonance at 430 MHz. Circular PCB capacitor simulated a resonance at 440 MHz.

Circular PCB capacitor simulated its minimum insertion loss at 220 MHz. T-Shaped PCB capacitor simulated its minimum insertion loss at 360 MHz. The difference between the Circular PCB capacitor's resonance and minimum insertion loss is 220 MHz, (440-220) MHz. The difference between the T-Shaped PCB capacitor's resonance and minimum insertion loss is only 70 MHz, (430-360) MHz. To reiterate, capacitors have many uses. Some capacitors can be used as coupling capacitors, while others can be used as filtering or shunt capacitors. Coupling capacitors can be used to facilitate efficient transfer of energy is required from one stage to another, such as in a series circuit. Shunt capacitors can be used to reduce frequencies that are unwanted, and in most cases are usually connected directly to ground.

The T-Shaped PCB capacitor simulations indicate that they could be the best capacitor type to be used as a coupling or series capacitor. This is due to its low insertion loss and only 70 MHz separation from minimum insertion loss and resonant frequencies. The Circular shaped PCB capacitor simulations indicate that it would be better suited as a shunt capacitor. This is due to its improved return loss. However, it should be appreciated that other profiles of broadside-coupled capacitors that can be integrated into PCB's as part of the manufacture process could emerge as being important, and could also theoretically function as shunt capacitors, series capacitors, or even other capacitors.

Figure 7:
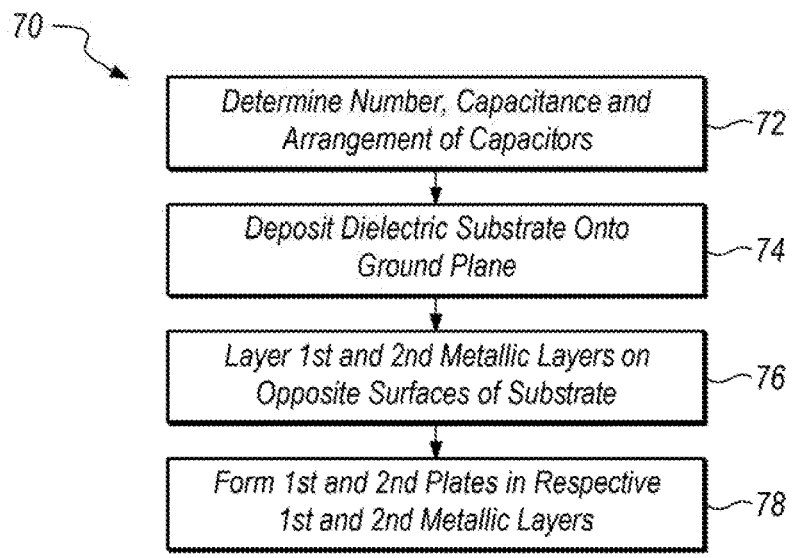

Referring now to FIG. 7, a block diagram 70 can be shown, which can depict steps that can be taken to accomplish the methods of the present invention according to several embodiments. As shown, method 70 can include the initial step 72 of determining the desired capacitance function (coupling or shunt), as well as the number, capacitance value and arrangement (layout) of capacitors 10. As shown by block 74, another step can be to deposit a dielectric substrate 12 onto a ground plane. In block 76, the methods can further include the step 76 of layering a first metallic layer 14 and a second metallic layer 16 so that metallic layers 14 and 16 can be in parallel planes on opposite surfaces 17a, 17b of the substrate 12. The methods can also include the step 78 of forming first plates 18 and second plates 20 in respective first metallic layers 14 and second metallic layers 16. The methods steps can be accomplished using the structure and cooperation of structure cited above.

There can be several advantages to this high power RF capacitor 10 of the present invention according to several embodiments. One advantage can be its manufacturability. When using a printed circuit board substrate for the capacitor design, repeatability is improved. Most printed circuit board manufactures are able to keep the metal shape tolerances to within 1 to 3 mils, and it can be advantageous for higher frequency and power application where lower loss can be dissipated as heat, and arcing can be reduced. Keeping within these tolerances can produce an accurate, repeatable high power RF capacitor 10. Another advantage when using printed circuit board material as a capacitor, is that any capacitor shape can be used. Various shapes (of plates 18, 20) can provide various frequency responses, which can be important in filter design. An example of a filter design where a fairly narrow band response is desired could be satisfied by a shunt capacitor would be a simple circular profile 26. In the same filter where a series capacitor is required, a branched out multiple T-shape profile 28 for metal plates 18, 20 could be used. The T-shaped profile 28 capacitor can produce a broader frequency response and can usually have less loss. Another advantage of the present invention can be that most printed circuit board material is capable of handling high power. There can be certain limitations on substrate 12 thickness, but most of the limitations can be overcome by an efficient RF filter design.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention can be described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof can be encompassed by the invention unless otherwise indicated herein or otherwise clearly contradicted by context.

What is claimed is:

1. A capacitor, comprising:
a circuit board substrate;
a first plate and a second plate deposited onto opposite surfaces of said substrate;
a via extending from one of said first plate and said second plate through said substrate to a trace coplanar with the other of said first plate and said second plate, for electrical broadside coupling of said first plate and said second plate;
wherein said first plate and said second plate have a T-shaped profile when viewed in plan view;
wherein said T-shaped profile can be a Yagi antenna profile defined by a spine and at least one crossbar; and
wherein the number of said at least one crossbar, and the top plan thickness, width and spacing between each at least one crossbar can be chosen according the design operating capacitance of said capacitor.

2. A circuit board comprising:
a dielectric substrate,
a first metallic layer deposited on said dielectric substrate;
a second metallic layer deposited on dielectric substrate so that said dielectric substrate is between said first metallic layer and said second metallic layer, to establish a broadside coupling capacitance effect between said first metallic layer and said second metallic layer;
wherein said first metallic layer and said second metallic layer have a T-shaped profile when viewed in plan view;

wherein said T-shaped profile is a Yagi antenna profile defined by a spine and at least one crossbar; and wherein the number of said at least one crossbar, and the top plan thickness, width and spacing between each at least one crossbar can be chosen according to the design of said broadside coupling capacitance.

\* \* \* \* \*